United States Patent
Koyama et al.

(10) Patent No.: US 10,128,633 B2
(45) Date of Patent: Nov. 13, 2018

(54) SURFACE EMITTING SEMICONDUCTOR LASER

(71) Applicant: SUMITOMO ELECTRIC INDUSTRIES, LTD., Osaka (JP)

(72) Inventors: Yuji Koyama, Kamakura (JP); Masaki Yanagisawa, Yokohama (JP); Yukihiro Tsuji, Tama (JP); Hirohiko Kobayashi, Machida (JP); Hiroyuki Yoshinaga, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/888,850

(22) Filed: Feb. 5, 2018

(65) Prior Publication Data

US 2018/0269655 A1 Sep. 20, 2018

(30) Foreign Application Priority Data

Mar. 17, 2017 (JP) ................. 2017-052637

(51) Int. Cl.
*H01S 5/00* (2006.01)
*H01S 5/042* (2006.01)
*H01S 5/22* (2006.01)
*H01S 5/183* (2006.01)
(Continued)

(52) U.S. Cl.
CPC ............ *H01S 5/0425* (2013.01); *H01S 5/187* (2013.01); *H01S 5/18394* (2013.01); *H01S 5/2202* (2013.01); *H01S 5/2206* (2013.01); *H01S 5/34313* (2013.01); *H01S 2304/04* (2013.01)

(58) Field of Classification Search
CPC .. H01S 5/0425; H01S 5/34313; H01S 5/2202; H01S 5/2206; H01S 5/187; H01S 5/18384; H01S 2304/04
See application file for complete search history.

(56) References Cited

U.S. PATENT DOCUMENTS

2004/0114653 A1* 6/2004 Omori ................. H01S 5/18311
372/46.01
2009/0201963 A1* 8/2009 Yoshikawa ............ B82Y 20/00
372/46.01
(Continued)

FOREIGN PATENT DOCUMENTS

JP 2004-200210 7/2004

*Primary Examiner* — Kinam Park
(74) *Attorney, Agent, or Firm* — Smith, Gambrell & Russell, LLP.

(57) ABSTRACT

A surface emitting semiconductor laser includes a post disposed on a substrate, the post including an active layer and a distributed Bragg reflector; a first insulating layer disposed on side and top surfaces of the post and on the substrate, the first insulating layer having an opening on the top surface of the post; an electrode disposed in the opening of the first insulating layer; an electric conductor including a pad electrode on the first insulating layer, the electric conductor extending on the first insulating layer to the electrode; and a second insulating layer disposed on the first insulating layer, the electrode, and the electric conductor so as to cover the electrode in the opening of the first insulating layer, the second insulating layer having an opening on the pad electrode, the opening of the second insulating layer having an edge on a top surface of the pad electrode.

8 Claims, 4 Drawing Sheets (51) Int. Cl.
*H01S 5/343* (2006.01)
*H01S 5/187* (2006.01)

(56) References Cited

U.S. PATENT DOCUMENTS

2010/0195689 A1* 8/2010 Ariga .................... H01S 5/0422
372/46.01
2016/0197455 A1* 7/2016 Okubo .................. H01S 5/0425
438/32
2017/0271839 A1* 9/2017 Tsuji .................... H01S 5/0203

* cited by examiner

SURFACE EMITTING SEMICONDUCTOR LASER

BACKGROUND OF THE INVENTION

1. Field of the Invention

The present invention relates to a surface emitting semiconductor laser.

2. Description of the Related Art

Patent Literature 1 (Japanese Unexamined Patent Application Publication No. 2004-200210) discloses a surface emitting semiconductor laser.

SUMMARY OF THE INVENTION

The surface emitting semiconductor laser disclosed in Patent Literature 1 includes a mesa, a ring-shaped electrode disposed on a top surface of the mesa, and an insulating layer. The ring-shaped electrode has an opening. The insulating layer is formed in the opening of the ring-shaped electrode and on a side surface of the mesa as a protective film. Simultaneously, the insulating layer formed in the opening of the ring-shaped electrode serves as part of a high reflection film. The surface emitting semiconductor laser emits a laser beam through the insulating layer in the opening of the ring-shaped electrode.

The surface emitting semiconductor laser disclosed in Patent Literature 1 has insufficient moisture resistance and low reliability. Thus, there is a demand for a surface emitting semiconductor laser with higher moisture resistance to obtain high reliability. A semiconductor device may include a protective film including the insulating layer having a large thickness to improve moisture resistance. In the surface emitting semiconductor laser that emits the laser beam through the insulating layer formed in the opening of the ring-shaped electrode, however, the thick insulating layer makes it difficult to control the reflectivity or transmissivity of the insulating layer.

A surface emitting semiconductor laser according to one aspect of the present invention includes a substrate having a principal surface including a first area and a second area surrounding the first area; a post disposed on the first area of the substrate, the post including a stacked semiconductor layer including an active layer and a distributed Bragg reflector; a first insulating layer disposed on a side surface of the post and on the first and second areas of the substrate, the first insulating layer having a first opening on a top surface of the post; a first electrode disposed in the first opening of the first insulating layer, the first electrode being in contact with the top surface of the post; a first electric conductor including a first pad electrode on the first insulating layer in the second area, the first electric conductor extending on the first insulating layer to the first electrode so as to connect the first pad electrode to the first electrode; and a second insulating layer disposed on the first insulating layer, the first electrode, and the first electric conductor so as to cover the first electrode in the first opening of the first insulating layer, the second insulating layer having a first opening on the first pad electrode, the first opening of the second insulating layer having an edge on a top surface of the first pad electrode.

The above and further objects, features, and advantages of the present invention will become more apparent from the following detailed description of preferred embodiments of the present invention with reference to the accompanying drawings.

DESCRIPTION OF THE PREFERRED EMBODIMENTS

Continuing from the above description, some specific embodiments will now be described.

A surface emitting semiconductor laser according to an embodiment includes (a) a substrate having a principal surface including a first area and a second area surrounding the first area; (b) a post disposed on the first area of the substrate, the post including a stacked semiconductor layer including an active layer and a distributed Bragg reflector; (c) a first insulating layer disposed on a side surface of the post and on the first and second areas of the substrate, the first insulating layer having a first opening on a top surface of the post; (d) a first electrode disposed in the first opening of the first insulating layer, the first electrode being in contact with the top surface of the post; (e) a first electric conductor including a first pad electrode on the first insulating layer in the second area, the first electric conductor extending on the first insulating layer to the first electrode so as to connect the first pad electrode to the first electrode; and (f) a second insulating layer disposed on the first insulating layer, the first electrode, and the first electric conductor so as to cover the first electrode in the first opening of the first insulating layer, the second insulating layer having a first opening on the first pad electrode, the first opening of the second insulating layer having an edge on a top surface of the first pad electrode.

In the surface emitting semiconductor laser, the first insulating layer is disposed on a side surface of the post, and on the first and second areas of the substrate. In addition, the first insulating layer has the first opening on the top surface of the post. The second insulating layer is disposed on the first insulating layer, the first electrode, and the first electric conductor so as to cover the first electrode in the first opening of the first insulating layer. The first opening of the first insulating layer has an edge disposed on the top surface of the post. The second insulating layer has the first opening on the first pad electrode. The first opening of the second insulating layer has an edge on the first pad electrode. The surface of the first pad electrode is exposed to humid air through the first opening of the second insulating layer. On the other hand, the first insulating layer, the first electrode, and the first electric conductor disposed on the top surface of the post are not exposed to humid air.

The surface emitting semiconductor laser according to an embodiment may further include an electrically conductive semiconductor region disposed on the principal surface of the substrate, the post being disposed on the electrically conductive semiconductor region in the first area of the substrate; a second electrode disposed on the electrically conductive semiconductor region; and a second electric conductor including a second pad electrode on the first insulating layer in the second area, the second electric conductor extending on the first insulating layer to the second electrode so as to connect the second pad electrode to the second electrode. The first insulating layer has a second opening separated from the post. The second electrode is in contact with the electrically conductive semiconductor region through the second opening of the first insulating layer. In addition, the second insulating layer has a second opening on the second pad electrode.

In the surface emitting semiconductor laser, the second insulating layer has the second opening on the second pad electrode. The second opening of the second insulating layer has an edge on the second pad electrode. The surface of the second pad electrode is exposed to humid air through the second opening of the second insulating layer. On the other hand, the first insulating layer, the second electrode, and the second electric conductor in the first and second areas are not exposed to humid air.

The surface emitting semiconductor laser according to an embodiment may further include a terrace disposed on the second area, the terrace including the first pad electrode thereon; and a groove that separates the terrace from the post. The second opening of the first insulating layer is disposed at a bottom of the groove.

In the surface emitting semiconductor laser, the terrace has the same layered structure as the post, and the first pad electrode is disposed at substantially the same level as the first electric conductor disposed on the post. In addition, in the surface emitting semiconductor laser, the groove facilitates coupling of the second pad electrode to the second electrode.

The surface emitting semiconductor laser according to an embodiment may further include an electrically conductive semiconductor layer on the principal surface of the substrate, the post being disposed on the electrically conductive semiconductor layer in the first area of the substrate; and a back electrode disposed on a back surface of the substrate. The substrate is made of an electrically conductive semiconductor. The back electrode is electrically connected to the electrically conductive semiconductor layer through the substrate.

In the surface emitting semiconductor laser, the back electrode may be used for electrical connection to the post.

The surface emitting semiconductor laser according to an embodiment may further include a third insulating layer disposed on the top surface of the post. The first electrode has an opening on the top surface of the post. The third insulating layer is disposed in the opening of the first electrode. The third insulating layer is in contact with the top surface of the post. In addition, the second insulating layer is disposed on the third insulating layer.

In the surface emitting semiconductor laser according to an embodiment, preferably, the second insulating layer and the third insulating layer constitute a high reflection film.

In the surface emitting semiconductor laser according to an embodiment, preferably, the principal surface of the substrate includes a third area surrounding the second area. The third area is not covered with the first insulating layer and the second insulating layer. The first insulating layer is disposed on the second area so as to surround the first area.

The second insulating layer covers an outer edge of the first insulating layer.

In addition, the third area includes a scribing groove.

In the surface emitting semiconductor laser, the second insulating layer covers the first insulating layer around the scribing area and prevents exposure of the edge of the first insulating layer.

The findings of the present invention will be better understood from the following detailed description with reference to the accompanying illustrative drawings. A surface emitting semiconductor laser and a method for producing a surface emitting laser according to an embodiment of the present invention will be described below with reference to the accompanying drawings. Like reference numerals denote like parts throughout the drawings.

Figure 1:
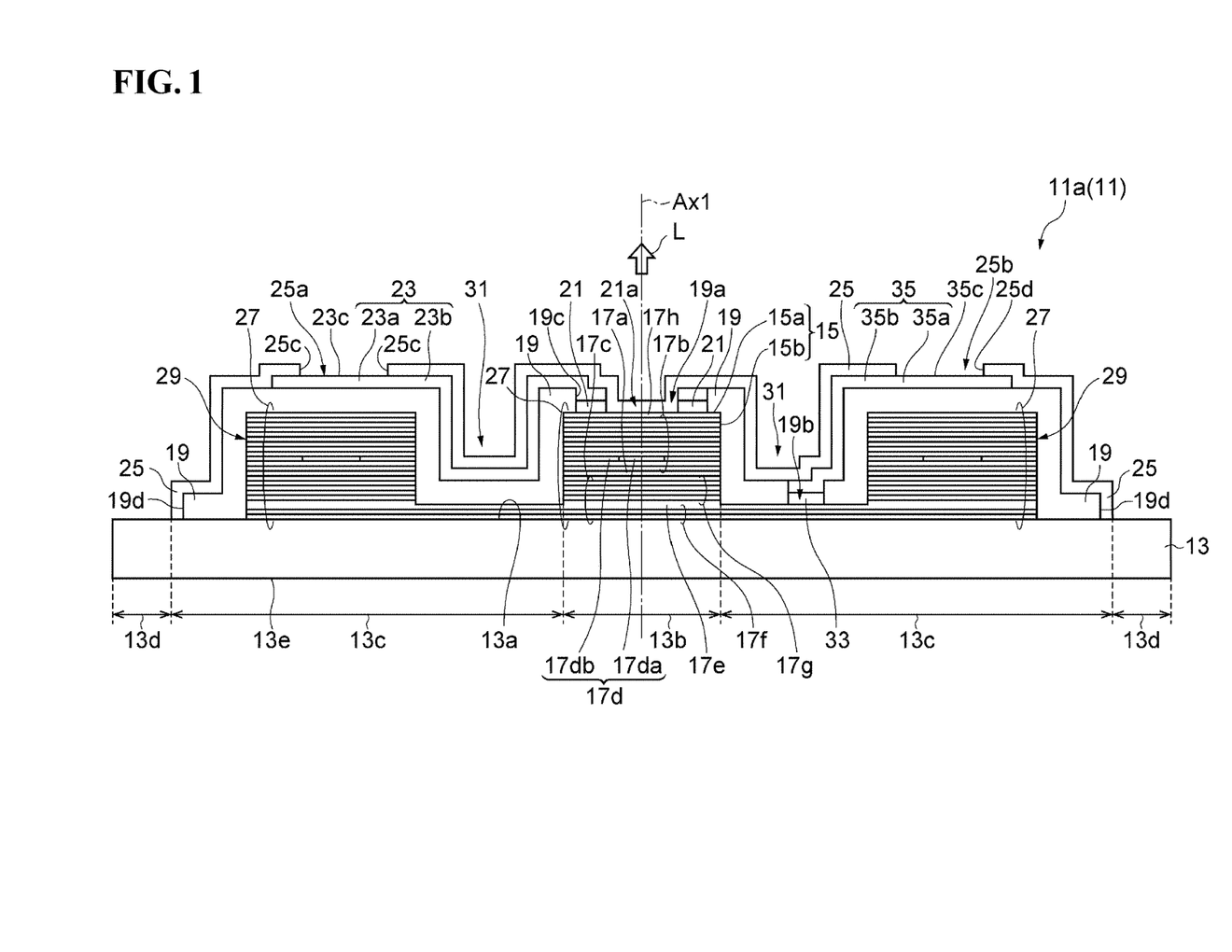
FIG. 1 is a cross-sectional view of a surface emitting semiconductor laser according to a first embodiment.
Figure 2:
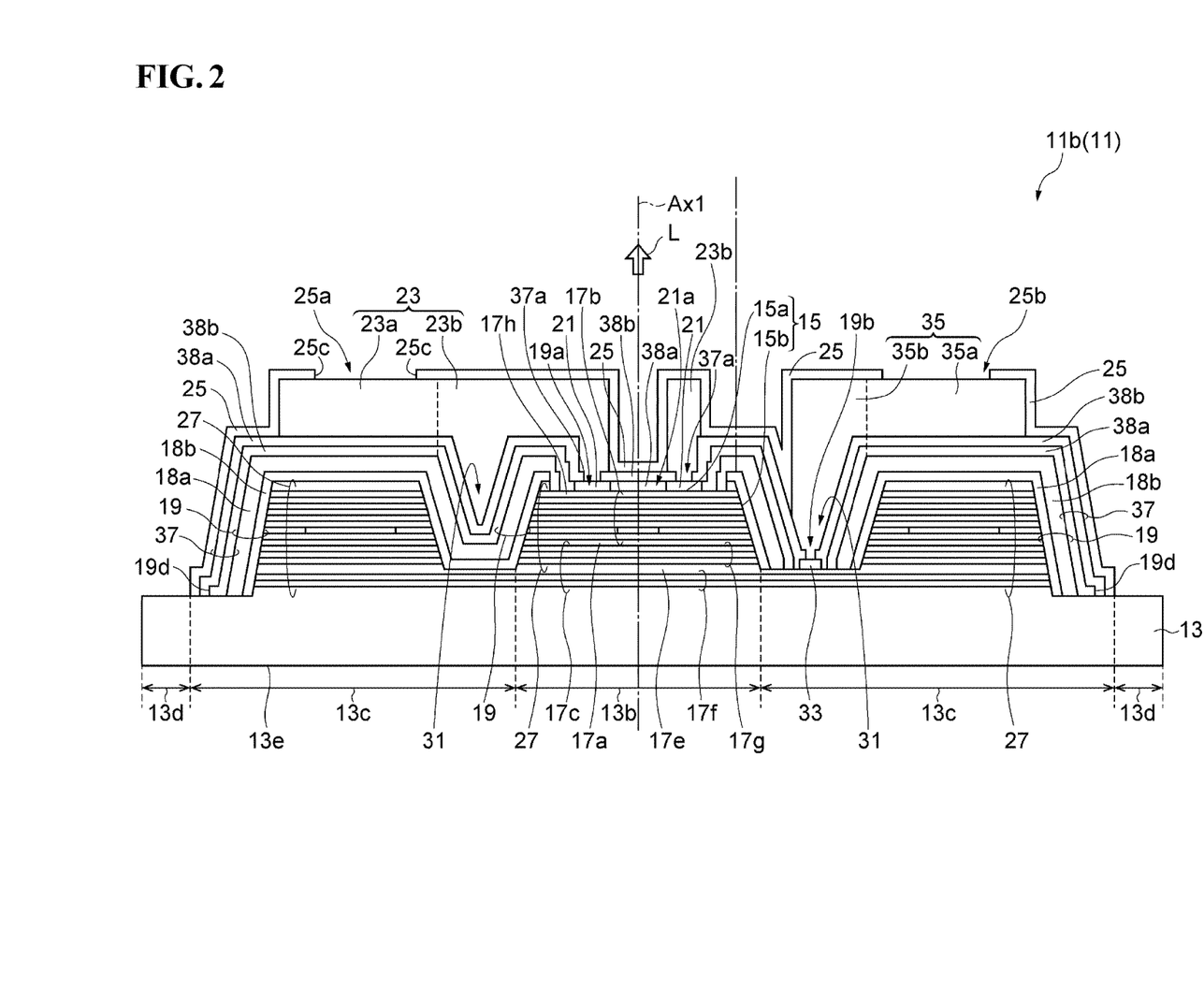
FIG. 2 is a cross-sectional view of a surface emitting semiconductor laser according to a second embodiment.
Figure 3:
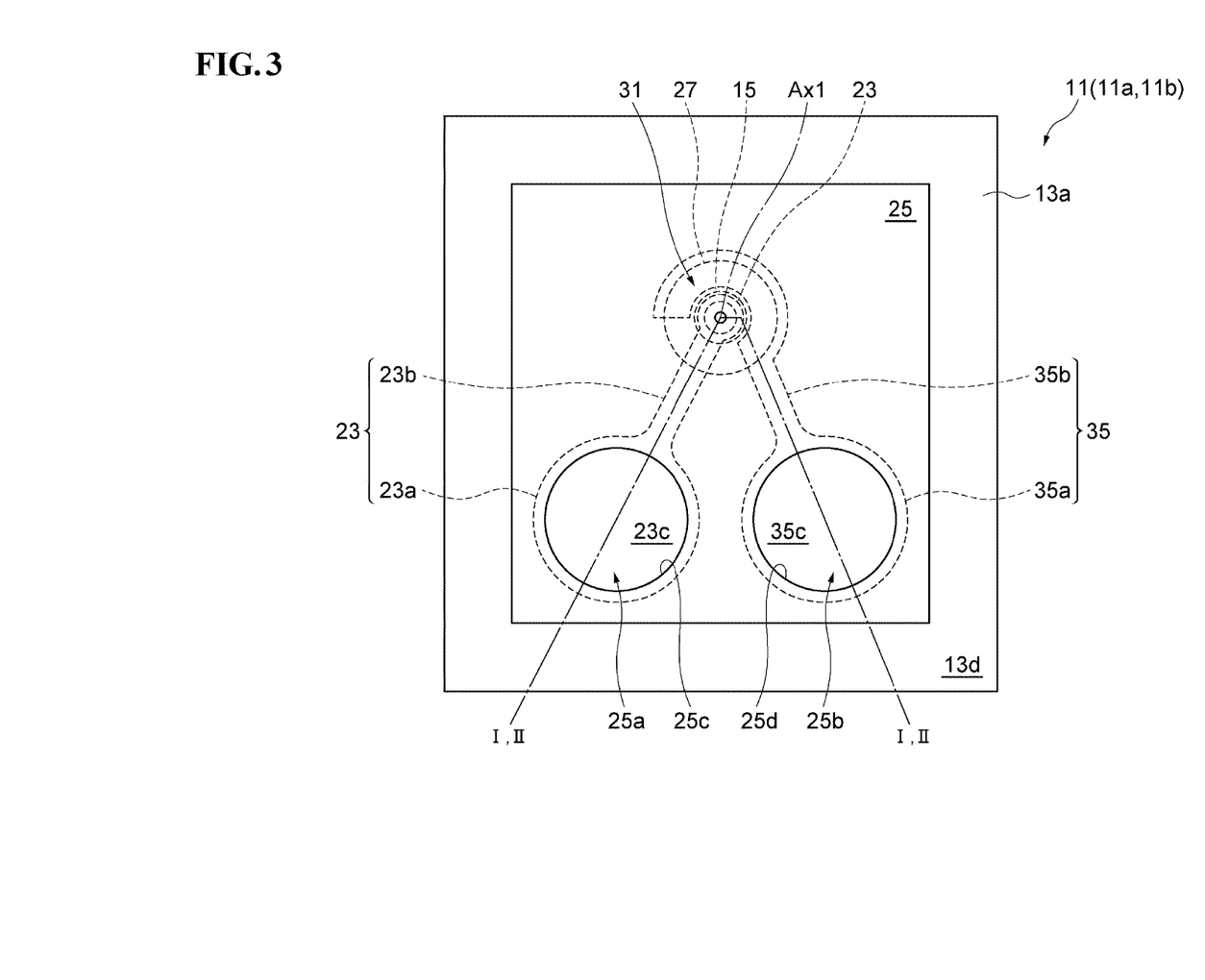
FIG. 3 is a plan view of the surface emitting semiconductor laser according to the first or second embodiment.

FIG. 1 is a cross-sectional view of a surface emitting semiconductor laser according to a first embodiment. FIG. 2 is a cross-sectional view of a surface emitting semiconductor laser according to a second embodiment. FIG. 3 is a plan view of the surface emitting semiconductor laser according to the first or second embodiment. The cross sections in FIGS. 1 and 2 are taken along the lines I-I and II-II, respectively, in FIG. 3.

A surface emitting semiconductor laser 11 (11a, 11b) is formed on a substrate 13. The substrate 13 has a principal surface 13a. The principal surface 13a includes a first area 13b and a second area 13c surrounding the first area 13b. The substrate 13 includes a semiconductor substrate, such as a III-V group compound semiconductor substrate. More specifically, the semiconductor substrate is a GaAs substrate.

The surface emitting semiconductor laser 11 (11a, 11b) includes a vertical cavity surface-emitting laser (VCSEL). A post 15 is disposed on the first area 13b of the substrate 13 and includes an active layer 17a, a first stacked semiconductor layer 17b for forming an upper distributed Bragg reflector, and a second stacked semiconductor layer 17c for forming a lower distributed Bragg reflector. The active layer 17a is disposed between the first stacked semiconductor layer 17b and the second stacked semiconductor layer 17c. A first insulating layer 19 has a first opening 19a on the top surface 15a of the post 15. The first insulating layer 19 is also disposed on a side surface 15b of the post 15, the first area 13b, and the second area 13c. More specifically, the first insulating layer 19 has an edge 19c that defines the first opening 19a. The edge 19c is closed on the top surface 15a of the post 15. The first insulating layer 19 is in contact with and covers the top surface 15a and the side surface 15b of the post 15. The first insulating layer 19 also covers the first area 13b and the second area 13c except the top surface 15a in the first opening 19a (and, if present, a top surface in a second opening of the first insulating layer 19 described later). A first electrode 21 is in contact with the top surface 15a of the post 15 in the first opening 19a of the first insulating layer 19 and is electrically connected to a top semiconductor layer in the post 15. A first electric conductor 23 includes a first pad electrode 23a and a first wire conductor 23b. The first pad electrode 23a and the first wire conductor 23b are disposed on the first insulating layer 19 in the second area 13c. The first wire conductor 23b extends on the first insulating layer 19 and connects the first pad electrode 23a to the first electrode 21. A second insulating layer 25 covers the first opening 19a of the first insulating layer 19 and is disposed on the top surface 15a of the post 15. The second insulating layer 25 has a first opening 25a on the first pad electrode 23a. The first opening 25a of the second insulating layer 25 has an edge 25c on the top surface 23c of the first pad electrode 23a. The first electrode 21 has a first opening 21a through which the surface emitting semiconductor laser 11 emits a laser beam L. The first wire conductor 23b is not disposed in the first opening 21a such that the surface emitting semiconductor laser 11 emits a laser beam L through the first opening 21a. The first electrode 21 has a closed stripe shape (for example, a ring shape) on the top surface 15a of the post 15 to ensure electrical contact. In the present embodiment, the first wire conductor 23b extends on the top surface 15a of the post 15 along the first electrode 21. Thus, the first wire conductor 23b is electrically connected to the first electrode 21.

In the surface emitting semiconductor laser 11 (11a, 11b), the first insulating layer 19 is disposed on the side surface 15b of the post 15, the first area 13b, and the second area 13c. The first insulating layer 19 has the first opening 19a in which the first electrode 21 is to be formed on the top surface 15a of the post 15. The second insulating layer 25 is disposed on the top surface 15a, on which the upper electrodes (21, 23b) and the edge 19c of the first opening 19a of the first insulating layer 19 are disposed. In addition, the second insulating layer 25 covers the first opening 19a of the first insulating layer 19. The upper electrodes (21, 23b) are in contact with the post 15 through the first opening 19a of the first insulating layer 19. The top surface 15a functions as a light emitting surface. The second insulating layer 25 covering the first opening 19a of the first insulating layer 19 and the first opening 21a of the first electrode 21 has the first opening 25a on the first pad electrode 23a. The first opening 25a has the edge 25c on the first pad electrode 23a. The surface of the first pad electrode 23a is exposed to humid air through the first opening 25a of the second insulating layer 25. A side surface of the first pad electrode 23a and an opening of the first insulating layer 19 are disposed on the first electrode 21. The first insulating layer 19, the first electrode 21, and the first wire conductor 23b are not exposed to humid air.

In the surface emitting semiconductor laser 11 (11a, 11b), more specifically, the first insulating layer 19 covers the first area 13b and the second area 13c except openings (for example, the first opening 19a) for electrical connection to a semiconductor region of the surface emitting semiconductor laser 11 (11a, 11b). The first electric conductor 23 extends on the first insulating layer 19 and is connected to the first electrode 21 in the first opening 19a of the first insulating layer 19. The second insulating layer 25 has an opening on the first electric conductor 23. More specifically, the second insulating layer 25 covers the first area 13b and the second area 13c except openings (for example, the first opening 25a) for electrical connection to the first pad electrode 23a of the surface emitting semiconductor laser 11 (11a, 11b). An opening of the underlying first insulating layer 19 (for example, the first opening 19a) is covered with the second insulating layer 25. An opening of the first insulating layer 19 (for example, the first opening 19a) and an opening of the second insulating layer 25 (for example, the first opening 25a) that are disposed at different positions may be separated from each other. In the surface emitting semiconductor laser 11 (11a, 11b), the edge 25c of the second insulating layer 25 on the first pad electrode 23a prevents an underlying insulating layer from being exposed in the pad opening.

The surface emitting semiconductor laser 11 (11a, 11b) having such a structure is not necessarily integrated into an assembly package and may be directly mounted on a circuit board, such as a printed circuit board. More specifically, the surface emitting semiconductor laser 11 (11a, 11b) may be of a surface mount type. Usually, the surface emitting semiconductor laser 11 (11a, 11b) of such a mount type is not protected by a hermetic sealing package and is exposed to humid air. As a humidity test, a storage test may be performed at a temperature of 85° C. and at a relative humidity of 85% for the surface emitting semiconductor laser 11. As a result of the humidity test for the surface emitting semiconductor laser 11, no significant degradation in electrical characteristics and light-emitting characteristics was observed for 2000 hours after the start of the humidity test.

Specific Example of Stacked Layer 27 of Post 15

A stacked layer 27 included in the post 15 will now be described. An active layer 17a includes an AlGaAs/GaAs multi quantum well (MQW) structure. A first stacked semiconductor layer 17b includes a p-type AlGaAs/p-type GaAs superlattice for forming an upper distributed Bragg reflector (DBR) structure. The upper DBR structure includes an oxidation confinement structure 17d. The oxidation confinement structure 17d includes a p-type AlGaAs 17da and an aluminum oxide layer 17db. A second stacked semiconductor layer 17c includes an AlGaAs/GaAs superlattice for forming a lower first DBR structure 17f and an n-type AlGaAs/n-type GaAs superlattice for forming a lower second DBR structure 17g. If necessary, the second stacked semiconductor layer 17c includes a lower contact layer 17e. The lower contact layer 17e is disposed between the first DBR structure 17f and the second DBR structure 17g. The post 15 is disposed on the lower contact layer 17e. The lower contact layer 17e includes an n-type GaAs layer, for example. An upper contact layer 17h is made of p-type GaAs, for example. The upper contact layer 17h is disposed on the first stacked semiconductor layer 17b and is in ohmic contact with the first electrode 21, for example.

Semiconductor layers for forming the active layer 17a, the first stacked semiconductor layer 17b, the second stacked semiconductor layer 17c, and the upper contact layer 17h are grown by a metal-organic vapor phase epitaxy (MOVPE) method, for example. The post 15 is formed by using a photolithography method and an etching method, for example. The insulating layers (19, 25) covering the semiconductor region including the post 15 are formed by using a chemical vapor deposition (CVD) method, for example. Metals serving as electrodes are deposited by using an evaporation method, a plating method, or a sputtering method. Metals are patterned, for example, by using a photolithography method and an etching method or by using a lift-off method.

If necessary, the surface emitting semiconductor laser 11 (11a, 11b) further has a concavity, for example, a groove 31. The surface emitting semiconductor laser 11 (11a, 11b) may further have a terrace 29 on the second area 13c. The groove 31 separates the terrace 29 from the post 15. The first pad electrode 23a is disposed on the terrace 29. In the surface emitting semiconductor laser 11 (11a, 11b), the terrace 29 includes the same stacked layer 27 as the post 15. Thus, the first pad electrode 23a is disposed at substantially the same level as the first electric conductor 23 disposed on the post 15.

The surface emitting semiconductor laser 11 (11a, 11b) includes electrically conductive semiconductor layers, such as the lower contact layer 17e and the second DBR structure 17g. The post 15 is disposed on the lower contact layer 17e. The terrace 29 may separate the first pad electrode 23a from the electrically conductive semiconductor layers.

Two Pad Electrodes on Front Surface

Next, the surface emitting semiconductor laser having two pad electrodes on a front surface will be described. In the embodiment, the surface emitting semiconductor laser 11 (11a, 11b) further includes a second electrode 33 in contact with the lower contact layer 17e in a second opening 19b of the first insulating layer 19, and a second electric conductor 35 on the first insulating layer 19 in the second area 13c. The second opening 19b of the first insulating layer 19 is separated from the post 15. The second electric conductor 35 includes a second pad electrode 35a and a second wire conductor 35b. The second pad electrode 35a and the second wire conductor 35b are disposed on the first insulating layer 19 in the second area 13c. The second wire conductor 35b extends on the first insulating layer 19 and connects the second pad electrode 35a to the second electrode 33. The second insulating layer 25 has a second opening 25b on the second pad electrode 35a. The second opening 25b of the second insulating layer 25 has an edge 25d on the top surface 35c of the second pad electrode 35a.

In the surface emitting semiconductor laser 11 (11a, 11b), the second insulating layer 25 has the second opening 25b on the second pad electrode 35a. The second opening 25b has the edge 25d on the top surface 35c of the second pad electrode 35a. The surface of the second pad electrode 35a is exposed to humid air through the second opening 25b of the second insulating layer 25. By contrast, the first insulating layer 19, the second electrode 33, and the second electric conductor 35 are not exposed to humid air.

In the surface emitting semiconductor laser 11 (11a, 11b), not only the first pad electrode 23a but also the second pad electrode 35a are disposed on the terrace 29. The first pad electrode 23a and the second pad electrode 35a are disposed at substantially the same level as the first electric conductor 23 disposed on the post 15. The second opening 19b of the first insulating layer 19 is disposed at the bottom of the groove 31. The groove 31 facilitates coupling of the second pad electrode 35a and the second electrode 33 to the underlying electrically conductive semiconductor region.

One Pad Electrode on Front Surface

The surface emitting semiconductor laser having a single pad electrode on a front surface will be described. The substrate 13 may be electrically conductive. In addition to the second pad electrode 35a on the front surface, the surface emitting semiconductor laser 11 (11a, 11b) may further include a back electrode in contact with the back side 13e of the substrate 13 (an electrode on the back side 13e). The back electrode on the back side of the surface emitting semiconductor laser 11 (11a, 11b) is electrically connected to an electrically conductive semiconductor region (17c) via the substrate 13. In the surface emitting semiconductor laser 11 (11a, 11b), the back electrode is electrically connected to the post. Therefore, the number of openings of the first insulating layer 19 (connections to the semiconductor) and the number of openings of the second insulating layer 25 (openings on the pad electrode) are decreased.

In the surface emitting semiconductor laser 11 (11a, 11b), the principal surface 13a of the substrate 13 has a third area 13d surrounding the second area 13c. For example, the third area 13d is used to form a scribing groove for chipping. The third area 13d is not covered with the first insulating layer 19 nor with the second insulating layer 25. In the present embodiment, the principal surface 13a of the substrate 13 is exposed in the third area 13d. The first insulating layer 19 has an opening for the first electrode 21 (and for the second electrode 33, if present) in the first area 13b and in the second area 13c. The opening of the first insulating layer 19 is covered with the second insulating layer 25. Furthermore, the second insulating layer 25 covers an outer edge 19d of the first insulating layer 19 around the boundary between the second area 13c and the third area 13d. In the surface emitting semiconductor laser 11 (11a, 11b), the second insulating layer 25 covers the first insulating layer 19 around the scribing area for device isolation and thereby prevents exposure of the outer edge 19d of the first insulating layer 19.

The surface emitting semiconductor laser 11a illustrated in FIG. 1 will be further described below. Preferably, the first insulating layer 19 is made of silicon oxynitride, such as SiON. The silicon oxynitride is produced by a thermal chemical vapor deposition (CVD) method or a plasma CVD method, for example. The first insulating layer 19 has a thickness in the range of 2000 to 5000 nm, for example. In the present embodiment, the first insulating layer 19 is in direct contact with a semiconductor layer in the post 15. In a process of forming the first insulating layer 19, the deposition conditions preferably ensure that the first insulating layer 19 covers the top surfaces and side surfaces of the post 15 and terrace 29.

Exemplary Deposition Conditions.

10% $SiH_4$ flow rate/$NH_3$ flow rate/$N_2$ flow rate/He flow rate: 10 to 30 sccm/1 to 2 sccm/50 to 200 sccm/500 to 1000 sccm.

RF power: 40 to 100 W.

Substrate temperature: 200° C. to 400° C.

The second insulating layer 25 is made of silicon nitride, such as SiN, for example. The silicon nitride is produced by a plasma CVD method, for example. The second insulating layer 25 has a thickness in the range of 200 to 400 nm, for example. In the embodiment, the second insulating layer 25 is in direct contact with the top surface of the semiconductor layer in the post 15. The second insulating layer 25 preferably has a thickness to function as a reflective layer at the wavelength of light emitted from the surface emitting semiconductor laser 11a. The first opening 21a of the first electrode 21 has a diameter in the range of 20 to 50 micrometers, for example. An inner edge that defines the first opening 21a of the first electrode 21 is disposed in the first opening 19a of the first insulating layer 19 and is covered with the second insulating layer 25. The second insulating layer 25 extends on the first insulating layer 19 to the edge 25c of the first opening 25a on the first pad electrode 23a so as to cover the post 15, the terrace 29, and the groove 31.

Preferably, the second insulating layer 25 has good coverage (covering) characteristics. However, experiments showed that a silicon-based inorganic insulator (for example, SiN) formed under the conditions for good coverage characteristics was not dense and had many pinholes. Pinholes cause reduction of the moisture resistance of the insulator. In order to achieve good coverage characteristics and desired moisture resistance, He gas may be supplied during the formation of the second insulating layer 25. The addition of He gas contributes to obtaining good coverage characteristics and desired moisture resistance.

Exemplary Deposition Conditions.

10% $SiH_4$ flow rate/$NH_3$ flow rate/$N_2$ flow rate/He flow rate: 10 to 30 sccm/1 to 2 sccm/50 to 200 sccm/500 to 1000 sccm.

RF power: 40 to 100 W.

Substrate temperature: 200° C. to 400° C.

In order to achieve good coverage characteristics and desired moisture resistance, alternatively, the second insulating layer 25 may be formed under different deposition conditions. For example, the deposition rate of a SiN film is decreased to form a dense film and thereby improve the moisture resistance of the SiN film. The different deposition conditions for the second insulating layer 25 are described below.

Exemplary Deposition Conditions.

First Deposition Conditions:
  10% SiH$_4$ flow rate: 80 sccm
  NH$_3$ flow rate: 1 to 5 sccm
  N$_2$ flow rate: 500 to 1000 sccm
  RF power: 40 to 100 W.
  Substrate temperature: 200° C. to 400° C.

Second Deposition Conditions:
  10% SiH$_4$ flow rate: 25 sccm
  NH$_3$ flow rate: 1 to 5 sccm
  N$_2$ flow rate: 500 to 1000 sccm
  RF power: 40 to 100 W.
  Substrate temperature: 200° C. to 400° C.

In the second deposition conditions, the SiH$_4$ flow rate is decreased from 80 sccm to 25 sccm, and thereby the deposition rate is decreased to approximately 40%. Consequently, the second insulating layer 25 formed under the first deposition conditions has good coverage characteristics. The second insulating layer 25 subsequently formed under the second deposition conditions has desired moisture resistance. A lower SiN film in contact with the first insulating layer 19 is preferably formed under the deposition conditions for desired coverage rather than for a dense film. An upper SiN film in contact with the atmosphere is preferably formed under the deposition conditions for a dense film with desired moisture resistance rather than for coverage. The lower layer film with desired coverage may fully cover the top surface to the side surface of the post 15 on which a relatively complicated structure is mounted. The dense upper layer film formed on the lower layer film may cover the top surface to the side surface of the post 15 on which a relatively complicated structure is mounted, and can thereby provide high moisture resistance. The second insulating layer 25 is preferably formed under the deposition conditions that ensure the coverage of the top surfaces and side surfaces of the post 15 and terrace 29.

Thus, the first insulating layer 19 and the second insulating layer 25 include the coverage patterns, respectively. In addition, the second insulating layer 25 has the coverage and film quality as described above. Therefore, the surface emitting semiconductor laser 11a with desired optical characteristics for light emission and desired moisture resistance may be provided.

A mask that defines the post 15 and the terrace 29 is formed on the surface of the stacked semiconductor layer grown on the substrate 13 by using a photolithography method. The stacked semiconductor layer includes the semiconductor layers for forming the active layer 17a, the first stacked semiconductor layer 17b, the second stacked semiconductor layer 17c, and the upper contact layer 17h. Subsequently, the post 15, the terrace 29, and the groove 31 are formed by etching the stacked semiconductor layer using the mask. An insulating layer for forming the first insulating layer 19 is then formed on a surface of the wafer including the post 15, the terrace 29, and the groove 31. The insulating layer is processed into the first insulating layer 19 by using a photolithography method and an etching method. In an electrode forming step, the first electrode 21 is formed on the post 15. The second electrode 33 is formed at the bottom of the groove 31. The first electric conductor 23 and the second electric conductor 35 are formed on these electrodes and on the first insulating layer 19 by using a lift-off method, an evaporation method, and a plating method. The first electric conductor 23 and the second electric conductor 35 are connected to the first electrode 21 and the second electrode 33, respectively. An insulating layer for forming the second insulating layer 25 is formed on the first electric conductor 23, the second electric conductor 35, and the first insulating layer 19. The insulating layer is processed into the second insulating layer 25 by using a photolithography method and an etching method. The insulating layer for forming the second insulating layer 25 is processed by etching such that the second insulating layer 25 has an opening on the first pad electrode 23a and on the second pad electrode 35a. In addition, the second insulating layer 25 covers surfaces of the stacked semiconductor layer, the first insulating layer 19, the first wire conductor 23b, and the second wire conductor 35b.

Figure 4:
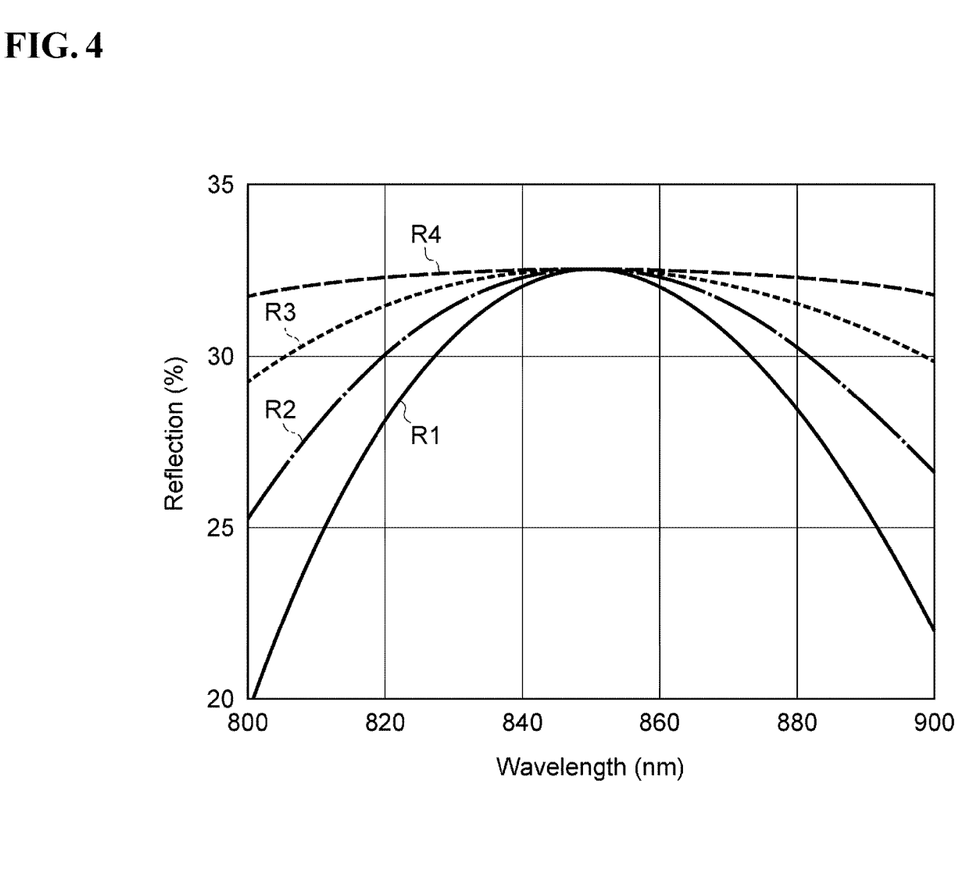
FIG. 4 is a graph showing the relationship between variations in the wavelength of output light (center wavelength: 850 nm) and the reflectivity of a reflective film.

FIG. 4 shows the reflectivity of a reflective film as a function of the wavelength of light for the reflective film having different thicknesses (R1, R2, R3, and R4). In FIG. 4, a center wavelength is set at 850 nm, for example. The reflectivity of a reflective film having a large thickness decreases greatly with wavelength. Because of its high moisture resistance and good coverage characteristics, the second insulating layer 25 has a small thickness.

The symbols of the characteristic lines (R1, R2, R3, and R4) and the thicknesses of high reflection films.

R1: A film thickness corresponding to two times the center wavelength in a high reflection film.

R2: A film thickness corresponding to 3/2 times the center wavelength in a high reflection film.

R3: A film thickness corresponding to the center wavelength in a high reflection film.

R4: A film thickness corresponding to half the center wavelength in a high reflection film.

The surface emitting semiconductor laser 11b illustrated in FIG. 2 will be further described below. The first insulating layer 19 is preferably made of silicon-based inorganic insulator, such as SiON or SiN. More specifically, the first insulating layer 19 includes a lower layer 18a and an upper layer 18b. The lower layer 18a contains a SiN film. The upper layer 18b contains a SiON film. These insulating layers are formed by a thermal chemical vapor deposition (CVD) method or a plasma CVD method, for example. The first insulating layer 19 is not limited to such a two-layer structure. The lower layer 18a of the first insulating layer 19 has a thickness in the range of 30 to 100 nm, for example. The upper layer 18b of the first insulating layer 19 has a thickness in the range of 200 to 1000 nm, for example. In the present embodiment, the first insulating layer 19 is in direct contact with a semiconductor layer in the post 15. In a process of forming the first insulating layer 19, the deposition conditions ensure that the first insulating layer 19 covers the top surfaces and side surfaces of the post 15 and terrace 29.

The second insulating layer 25 is made of silicon nitride, such as SiN. The silicon nitride is produced by using a plasma CVD method, for example. The second insulating layer 25 has a thickness in the range of 100 to 300 nm, for example. In the present embodiment, the second insulating layer 25 is in direct contact with the top surfaces and side surfaces of the pad electrodes.

A high reflection (HR) film is disposed on the top surface of the post 15. In order to achieve good optical characteristics and high moisture resistance of the high reflection (HR) film, the surface emitting semiconductor laser 11b may further include a third insulating layer 37.

The third insulating layer 37 is preferably made of silicon nitride, such as SiN. The silicon nitride is produced by using a plasma CVD method, for example. The third insulating layer 37 has a thickness in the range of 200 to 500 nm, for example. In the present embodiment, the third insulating layer 37 is disposed between the first insulating layer 19 and the second insulating layer 25 except on the top surface 15a of the post 15, on which the first opening 19a of the first insulating layer 19 is disposed. The third insulating layer 37 is in contact with the top surface 15a of the post 15. On the top surface 15a of the post 15, the second insulating layer 25 is disposed on the third insulating layer 37. More specifically, the third insulating layer 37 includes a lower layer 38a and an upper layer 38b. The lower layer 38a contains a SiN film, and the upper layer 38b contains a SiN film. The lower layer 38a acts as a spacer for evaporation and lift-off in the formation of the first electrode 21. The upper layer 38b fills the space between the lower layer 38a and the first electrode 21.

The second insulating layer 25, the lower layer 38a, and the upper layer 38b constitute a high reflection film. Some of the second insulating layer 25, the lower layer 38a, and the upper layer 38b (for example, the upper layer 38b of the third insulating layer 37 and the second insulating layer 25) are configured to provide high moisture resistance. In this structure, the surface emitting semiconductor laser is covered with the insulating layers with high moisture resistance and has high moisture resistance by itself. The third insulating layer 37 extends under the first electric conductor 23 and the second electric conductor 35 except on the top surface 15a of the post 15. The film with high moisture resistance, more specifically, the second insulating layer 25 fully covers the top surface 15a of the post 15. The lower layer 38a of the third insulating layer 37 fully covers the first opening 21a of the first electrode 21. The upper layer 38b of the third insulating layer 37 has a third opening 37a on the top surface of the first electrode 21 in the first opening 21a of the first electrode 21. The upper layer 38b of the third insulating layer 37 extends on and fully covers the lower layer 38a of the third insulating layer 37 and the top surface of the first electrode 21 in the first opening 21a of the first electrode 21. The lower layer 38a and the upper layer 38b of the third insulating layer 37 outside the first opening 21a of the first electrode 21 extend on the first insulating layer 19. The upper layer 38b of the third insulating layer 37 fully covers the semiconductor region in the first area 13b except the third opening 37a.

A mask that defines the post 15 and the terrace 29 is formed on the surface of the stacked semiconductor layer grown on the substrate 13 by using a photolithography method. The stacked semiconductor layer includes the semiconductor layers for forming the active layer 17a, the first stacked semiconductor layer 17b, the second stacked semiconductor layer 17c, and the upper contact layer 17h. Subsequently, the post 15, the terrace 29, and the groove 31 are formed by etching the stacked semiconductor layer using the mask. An insulating layer for forming the lower layer 18a of the first insulating layer 19 is formed on a surface of the wafer including the post 15, the terrace 29, and the groove 31. The insulating layer is processed into the lower layer 18a of the first insulating layer 19 by using a photolithography method and an etching method. The lower layer 18a has openings on the top surface 15a of the post 15 and at the bottom of the groove 31, respectively. Semiconductor layers in the stacked semiconductor layer are exposed through these openings. An insulating layer for forming the upper layer 18b of the first insulating layer 19 is formed on the lower layer 18a of the first insulating layer 19 and on the opening of the lower layer 18a. The insulating layer is processed into the upper layer 18b of the first insulating layer 19 by using a photolithography method and an etching method. The upper layer 18b has openings disposed on the top surface 15a of the post 15 and at the bottom of the groove 31, respectively. The openings of the upper layer 18b are located approximately in the same position as the openings of the lower layer 18a. Semiconductor layers are exposed through these openings of the upper layer 18b and the lower layer 18a. The openings of the upper layer 18b are smaller in area than the openings of the lower layer 18a. The upper layer 18b covers the edge that defines each opening of the lower layer 18a. The first opening 19a of the first insulating layer 19 includes the opening of the upper layer 18b and the opening of the lower layer 18a. The second opening 19b of the first insulating layer 19 includes the opening of the upper layer 18b and the opening of the lower layer 18a.

In an electrode forming step, the first electrode 21 is formed on the post 15. The second electrode 33 is formed at the bottom of the groove 31. The top surface 15a of the post 15 is exposed through the first opening 21a of the first electrode 21. An insulating layer for forming the lower layer 38a of the third insulating layer 37 is formed on the first insulating layer 19, the first electrode 21, and the second electrode 33. The insulating layer is processed by using a photolithography method and an etching method into the lower layer 38a so as to cover the first opening 21a. An insulating layer for forming the upper layer 38b of the third insulating layer 37 is formed on the first insulating layer 19, the lower layer 38a, the first electrode 21, and the second electrode 33. The insulating layer is processed by using a photolithography method and an etching method to form an opening on the first electrode 21 and the second electrode 33. The upper layer 38b covers the edge of the opening of the lower layer 38a. The top surfaces of the first electrode 21 and the second electrode 33 are exposed through the openings of the upper layer 38b in the first area 13b and the second area 13c. The first electric conductor 23 and the second electric conductor 35 are formed on the upper layer 38b, the first electrode 21, and the second electrode 33 by using a lift-off method, an evaporation method, and a plating method. The first electric conductor 23 and the second electric conductor 35 are connected to the first electrode 21 and the second electrode 33, respectively. An insulating layer for forming the second insulating layer 25 is formed on the first electric conductor 23, the second electric conductor 35, and the upper layer 38b of the third insulating layer 37. The insulating layer is processed into the second insulating layer 25 by using a photolithography method and an etching method. The insulating layer for forming the second insulating layer 25 is processed by etching. After the etching process, the second insulating layer 25 has an opening on the first pad electrode 23a and on the second pad electrode 35a. In addition, the second insulating layer 25 covers the third insulating layer 37, the first wire conductor 23b, and the second wire conductor 35b.

Thus, the first insulating layer 19, the second insulating layer 25, and the third insulating layer 37 include the coverage patterns, respectively. In addition, the second insulating layer 25 and the upper layer 38b of the third insulating layer 37 have the coverage and film quality as described above. Therefore, the surface emitting semiconductor laser 11b with desired moisture resistance may be provided. Furthermore, the second insulating layer 25 and the lower layer 38a and the upper layer 38b of the third insulating layer 37 constitute the high reflection film having high reflectivity at the wavelength of light emitted from the surface emitting semiconductor laser 11b so as to achieve desired optical characteristics.

Although the principle of the present invention is illustrated and described with the preferred embodiments, a person skilled in the art will recognize that arrangements and details in the present invention can be modified without departing from the principle. The present invention should not be limited to the specific structures disclosed in the embodiments. The present invention encompasses all modifications and alterations that fall within the scope and spirit of the appended claims.

What is claimed is:

1. A surface emitting semiconductor laser comprising:
   a substrate having a principal surface including a first area and a second area surrounding the first area;
   a post disposed on the first area of the substrate, the post including a stacked semiconductor layer including an active layer and a distributed Bragg reflector;
   a first insulating layer disposed on a side surface of the post and on the first and second areas of the substrate, the first insulating layer having a first opening on a top surface of the post;
   a first electrode disposed in the first opening of the first insulating layer, the first electrode being in contact with the top surface of the post;
   a first electric conductor including a first pad electrode on the first insulating layer in the second area, the first electric conductor extending on the first insulating layer to the first electrode so as to connect the first pad electrode to the first electrode; and
   a second insulating layer disposed on the first insulating layer, the first electrode, and the first electric conductor so as to cover the first electrode in the first opening of the first insulating layer, the second insulating layer having a first opening on the first pad electrode, the first opening of the second insulating layer having an edge on a top surface of the first pad electrode.

2. The surface emitting semiconductor laser according to claim 1, further comprising:
   an electrically conductive semiconductor region disposed on the principal surface of the substrate, the post being disposed on the electrically conductive semiconductor region in the first area of the substrate;
   a second electrode disposed on the electrically conductive semiconductor region; and
   a second electric conductor including a second pad electrode on the first insulating layer in the second area, the second electric conductor extending on the first insulating layer to the second electrode so as to connect the second pad electrode to the second electrode,
   wherein the first insulating layer has a second opening separated from the post,
   the second electrode is in contact with the electrically conductive semiconductor region through the second opening of the first insulating layer, and
   the second insulating layer has a second opening on the second pad electrode.

3. The surface emitting semiconductor laser according to claim 2, further comprising:
   a terrace disposed on the second area, the terrace including the first pad electrode thereon; and
   a groove that separates the terrace from the post,
   wherein the second opening of the first insulating layer is disposed at a bottom of the groove.

4. The surface emitting semiconductor laser according to claim 1, further comprising:
   an electrically conductive semiconductor layer on the principal surface of the substrate, the post being disposed on the electrically conductive semiconductor layer in the first area of the substrate; and
   a back electrode disposed on a back surface of the substrate,
   wherein the substrate is made of an electrically conductive semiconductor, and
   the back electrode is electrically connected to the electrically conductive semiconductor layer through the substrate.

5. The surface emitting semiconductor laser according to claim 1, further comprising a third insulating layer disposed on the top surface of the post,
   wherein the first electrode has an opening on the top surface of the post,
   the third insulating layer is disposed in the opening of the first electrode,
   the third insulating layer is in contact with the top surface of the post, and
   the second insulating layer is disposed on the third insulating layer.

6. The surface emitting semiconductor laser according to claim 5, wherein the second insulating layer and the third insulating layer constitute a high reflection film.

7. The surface emitting semiconductor laser according to claim 1, wherein
   the principal surface of the substrate includes a third area surrounding the second area,
   the third area is not covered with the first insulating layer and the second insulating layer,
   the first insulating layer is disposed on the second area so as to surround the first area, and
   the second insulating layer covers an outer edge of the first insulating layer.

8. The surface emitting semiconductor laser according to claim 7, wherein the third area includes a scribing groove.

* * * * *